SWEEP OSCILLATOR UNIT EMPLOYING DIGITAL FEEDBACK

Filed Oct. 30, 1967

INVENTOR,
FRANCIS C. MARTIN, JR.

BY Strauch, Nolan, Neale, Nies & Kurz
ATTORNEYS 3,504,294

SWEEP OSCILLATOR UNIT EMPLOYING DIGITAL FEEDBACK

Francis C. Martin, Jr., San Diego, Calif., assignor, by mesne assignments, to Ametek, Inc., New York, N.Y., a corporation of Delaware Filed Oct. 30, 1967, Ser. No. 678,946
Int. Cl. H03b *3/04*
U.S. Cl. 331—4 10 Claims

ABSTRACT OF THE DISCLOSURE

A sweep oscillator unit employing digital feedback to correct the linearity of a swept frequency output and the frequency value of a constant frequency output. A controlled oscillator means is provided for generating a train of output signals having a frequency dependent upon the magnitude of an input or control signal. The input or control signal is such that the controlled oscillator means selectively generates a linear ramp frequency output signal or a constant frequency "rest" output signal. These output signals are periodically sampled and are applied to a counter means such that the counter means counts down from selected preset reference counts therein. Any remaining count in the counter means subsequent to each sampling period is utilized to provide a correcting error or control input signal to the controlled oscillator means. Periodic sampling of the output signals and subsequent correction takes place throughout the operative period of the oscillator to thus dynamically correct the linearity of the swept frequency output and the frequency value of the constant frequency output.

Figure 1:
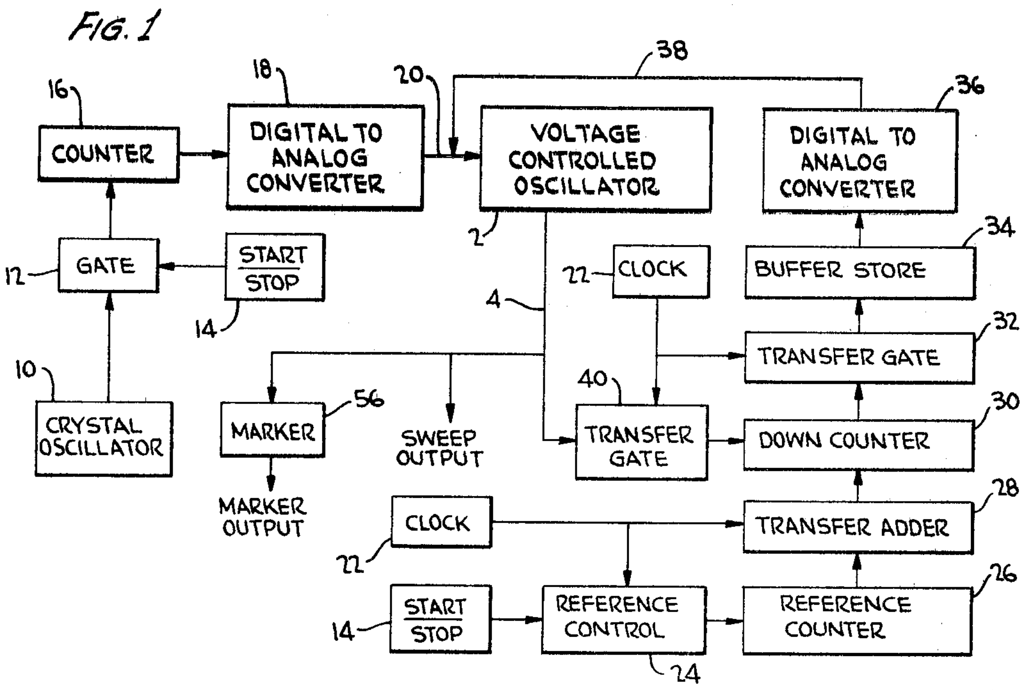

This invention generally relates to oscillators and more particularly relates to sweep oscillator units which employ digital feedback techniques.

In many and diverse electronic applications, the need arises for the generation of signal outputs having a sweep frequency characteristic, that is, a signal whose frequency varies in a predetermined rate with elapsed time. Such a signal output finds wide application in the determination of transient behavior of electrical circuits, in spectral-analysis and in frequency-modulated sonar applications.

Quite frequently, a condition precedent to the effective utilization of such signals is that the rate of change of the output frequency be linear with respect to elapsed time to within extremely fine tolerances. Difficulties arise in this regard due to inherent non-linearities of the controlled oscillators most frequently used to produce these desired output signals. Additionally, the linearity of sweep or ramp output signals is adversely affected by the presence of electrical disturbances and the like within the signal or oscillating unit itself and in its power supply lines. Accordingly, in such critical applications, some feedback technique must be provided which will correct the swept frequency output signal and insure that it follows a truly linear function. Naturally, a measure of control over the absolute frequencies generated is also necessary to effect versatility of the unit.

Accordingly, it is an object of the subject invention to provide a sweep oscillator unit employing feedback techniques that insure accurate control of the absolute frequencies generated.

It is a further object of the subject invention to provide a sweep oscillator unit employing feedback techniques effective to control the absolute linearity of a swept frequency output signal.

It is another object of the subject invention to provide a sweep oscillator unit employing feedback techniques which correct for inherent non-linearities within the oscillator utilized as well as for external disturbances.

Now, in order to implement these and still further objects of the subject invention which will become more readily apparent as the description proceeds, there is provided a sweep oscillator unit which employs digital feedback techniques to insure the linearity of a swept frequency output signal and the control of absolute frequencies generated. A controlled oscillator unit is provided which, by virtue of the control input signal thereto, selectively generates a constant "rest" frequency train of output signals and, upon triggering, a train of output signals exhibiting a linear ramp frequency characteristic over a predetermined sweep period. The train of output signals is periodically sampled during successive sampling periods throughout the operation of the unit, a digital sampling signal representative of the number of output signals in the train of output signals occurring during each sampling period thus being produced. The digital sampling signal is fed into a digital down-counter causing the down-counter to count down from an existing count therein. A reference counter containing a predetermined selected count is further provided, the predetermined selected count of the reference counter being added to any existing count in the down-counter between each sampling period to provide a new existing count for the next successive sampling period. The count remaining in the down-counter after each insertion of the digital sampling signal thereto and subsequent to each individual sampling period is operative to provide an error control or feedback signal to the controlled oscillator means which effects the correction of the frequency output and assures linearity of the sweep.

The sweep oscillator unit operates in the above-described fashion when either the swept frequency output or the constant, "rest" frequency output is generated. When the output signal frequency selected is the constant or "rest" mode, the predetermined selected count within the reference counter is set to a constant value for each successive sampling period. However, when the sweep frequency or ramp signal output is selected or generated, the reference counter is preset to a value during each successive sampling period that varies in a predetermined stepwise fashion from the value of the count preset during the preceding sampling period. Thus, a feedback system is provided which periodically samples output frequency of a controlled oscillator and dynamically corrects same during actual generation of both a constant, absolute frequency and a swept or linear ramp frequency.

Figure 2:
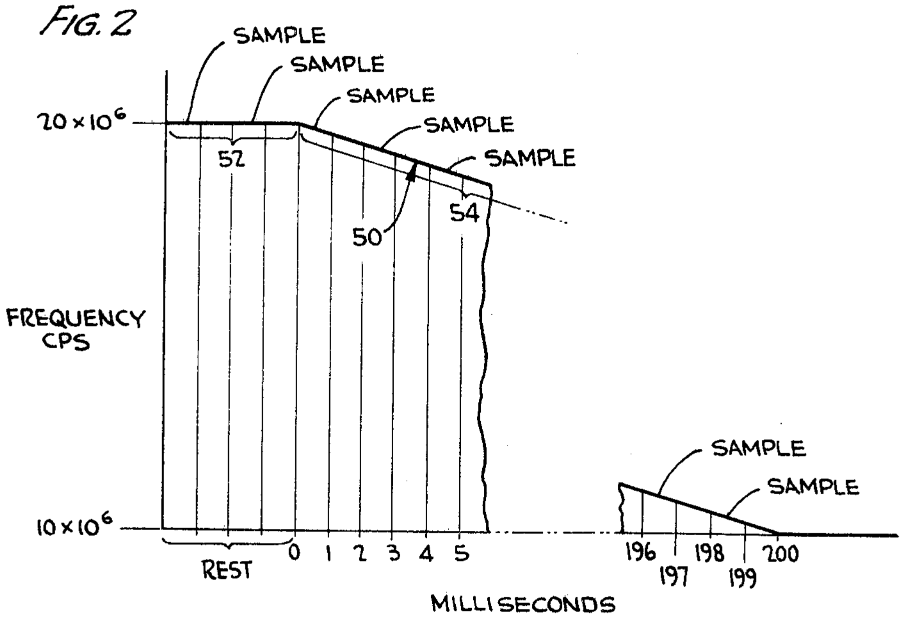

Still further objects and important features of the subject invention will become evident when reference is given to the following detailed description of the preferred embodiments thereof along with the accompanying drawings, wherein:

FIGURE 1 is a functional block diagram depicting the operation of a sweep oscillator unit constructed in accordance with the subject invention; and FIGURE 2 is a graphical representation of a frequency output signal depicting the successive sampling periods thereof.

Referring now to FIGURE 1, a sweep oscillator unit exemplifying the subject invention is functionally depicted, the central component of which comprises a voltage controlled oscillator 2 which produces a train of output signals along line 4, the frequency of which is dependent upon the magnitude or level of the control input signal on line 20.

The control input signal on line 20 for the voltage controlled oscillator 2 is generated by a digital-to-analog converter 18 which is controlled by a digital counter 16 which is, in turn, driven by a crystal oscillator 10 through a control gate 12. Control gate 12 is, as depicted, opened or closed in accordance with the production of "start" or "stop" signals from the functional block designated 14 which may comprise external utilization equipment.

The system as thus far described is operative, when gate 12 is blocking or closed, to cause the voltage controlled oscillator 2 to generate a single frequency train of output signals along line 4, the frequency of the single frequency train comprising the "rest" frequency of the voltage controlled oscillator 2 which may be set to any desired value. When gate 12 is conducting or opened, the crystal oscillator 10 is effective to operate the counter 16 to produce a digital signal, this signal being inserted into the digital-to-analog converter 18 such that the output of the digital-to-analog converter 18 assumes a unidirectional linear voltage ramp. The linear voltage ramp thus imposed on line 20 causes the voltage controlled oscillator 2 to generate a train of output signals upon line 4 having a substantially linear ramp frequency characteristic.

As is apparent, the actual linear rate of change of the train of output signals from the voltage controlled oscillator 2 and the actual "rest" frequency output thereof as described can, of course, be dimensioned as desired by suitable selection of the frequency of the crystal oscillator 10, the number of stages and interconnection of the counter 16, and the particular characteristics of the digital-to-analog converter 18 as well as other components to be described below. For purposes of illustration and clarity hereinbelow, however, it can be assumed that the dimensioning of the crystal oscillator 10, counter 16, and digital-to-analog converter 18 is such that the voltage controlled oscillator 2 generates a train of output signals having a "rest" frequency of $20\times10^6$ c.p.s., and a sweep or ramp frequency proceeding linearly downward from the "rest" frequency of $20\times10^6$ c.p.s. to a frequency of $10\times10^6$ c.p.s. over a sweep period of 200 milliseconds. With the above-assumed characteristics, it will be evident that when the gate 12 is opened by production of a "start" signal from block 14, the voltage controlled oscillator 2 will generate a train of output signals having a frequency sweep characteristic starting at $20\times10^6$ c.p.s. and proceeding linearly downward to a frequency of $10\times10^6$ c.p.s. a 200 millisecond sweep period at a sweep rate of $50\times10^3$ cycles per millisecond. A graphical representation of this frequency output from the voltage controlled oscillator 2 can be found by reference to FIGURE 2.

The above-described oscillator unit is capable of generating both a constant frequency train of output signals and a train of output signals exhibiting a ramp frequency characteristic but has no feedback means included wherein the absolute frequency output as well as the linearity of the swept frequency output can be insured. Accordingly, the accuracy of operation and utility of such a system is somewhat restricted. To overcome these drawbacks, a unique feedback arrangement is utilized employing digital techniques. This feedback arrangement is effective to periodically montor the instantaneous frequency of the output signals generated by the voltage controlled oscillator at repeated intervals throughout the generation of the output signal train. These monitored samples are repeatedly compared with reference signals generated internally of the sweep oscillator unit to produce an "error" control signal which dynamically corrects both the absolute frequency of the train of output signals generated by the voltage controlled oscillator 2 when in a "rest" condition or mode and the linearity of the ramp or sweep frequency characteristic of the output signals generated in the other operational mode.

In FIGURE 2, a graphical representation of this sampling technique as applied to linear swept frequency output signals and a constant "rest" frequency output signal from voltage controlled oscillator 2 is depicted. Initially, it can be assumed that the voltage controlled oscillator 2 is at "rest," that is, generating a train of output signals having a "rest" frequency of $20\times10^6$ c.p.s. This particular "rest" frequency generation and the time interval or period during which it occurs is depicted by reference numeral 52 on the frequency-time "curve" generally designated 50. It is to be noted that the abscissa of the frequency-time "curve" is representative of elapsed time, with each division being equal to one millisecond. The ordinate of the frequency-time "curve" is representative of the frequency of the train of output signals from the voltage controlled oscillator 2 and is illustrated as running between $20\times10^6$ c.p.s. and $10\times10^6$ c.p.s. during the sweep period of 200 milliseconds.

While the sweep oscillator unit is generating a "rest" frequency train of output signals, periodic digital samples of these output signals are taken at approximately two millisecond intervals as shown in FIGURE 2 by the sample designation and as controlled by the operation of clock 22. During each sampling period, a digital sampling signal is thus produced representative of the number of output signals occurring during the sampling period. These sampling signals are applied through a transfer gate 40 into a down-counter 30 causing the down-counter 30 to count down from an existing count therein during each sampling period. During alternate time intervals, that is during the approximately 1 millisecond time period between each sampling period, a predetermined selected count generated by the reference counter 26 under the influence of the reference control 24 is added through the transfer adder 28 to the existing count in the downcounter 30. This predetermined selected count is set to be equal to the number of output signals in the train of output signals generated by the voltage controlled oscillator 2 that should occur during each one millisecond sampling period if the sweep oscillator unit was functioning in a perfect manner. That is, the predetermined selected count is set to the expected value of the digital sampling signal occurring during the next sampling period.

Since the voltage controlled oscillator 2 was initially assumed to be functioning at its "rest" frequency, that is generating a train of output signals having a frequency of $20\times10^6$ c.p.s. it can be easily seen that 20,000 output signals would be generated by the voltage controlled oscillator 2 during each millisecond of proper operation. Accordingly, the reference control 24 will, during each sampling period as determined by clock 22, preset the reference counter 26 to this predetermined selected number of 20,000 counts. Then, between each sampling period again as determined by clock 22, this preset count of 20,000 will be transferred from the reference counter 26 by the operation of transfer adder 28 and added to the existing count within the down-counter 30. During each sampling period of approximately one millisecond, a digital sampling signal representative of the number of output signals that actually are generated by the voltage controlled oscillator 2 will be fed into the down-counter 30 through the transfer gate 40 causing the down-counter 30 to count down from the existing count therein.

In this example, down-counter 30 was initially preset to an existing count of 20,000. If during the next one millisecond sampling period, 20,000 output signals actually do occur, then the remaining count in the down-counter 30 after the sampling period will be zero. However, if more or less than 20,000 output signals occur during the one millisecond sampling period, then a remaining count or remainder will be present in the down-counter 30 at the end of the sampling period, this remainder constituting an "error" count. The "error" count is transferred through the transfer gate 32 and a buffer storage 34 into a digital-to-analog converter 36 during the time interval immediately following the sampling period to produce a control output or "error" control signal along line 38 to the input 20 of the voltage controlled oscillator 2. This "error" control signal modifies the driving control signal delivered by the digital-to-analog converter 18 so as to therefore modify the output frequency of the train of output signals generated by voltage controlled oscillator 2. If a "positive" count remained in the down-counter 30 after a sampling period, this "positive" count would indicate that too few output signals had occurred during the preceding sampling period. Accordingly, the output frequency from the voltage controlled oscillator 2 would be increased in this instance. Obviously, if a "negative" "error" control count existed, the output frequency of the voltage controlled oscillator 2 would be decreased.

The timing of the various functions described above for each sampling period is controlled by operation of clock 22 as discussed. The sweep oscillator unit may be placed into its "rest condition," that is into a condition generating a train of output signals having a single constant frequency of $20\times10^6$ c.p.s., for example, by application of a "stop" pulse from the functional block designated 14 which, in practice, would be associated with any equipment utilizing the sweep oscillator output. This "stop" pulse blocks gate 12 and, as described above, causes an output frequency of $20\times10^6$ c.p.s. to be generated by the voltage controlled oscillator 2. The "stop" pulse additionally operates the reference control unit 24 such that, during the first millisecond of oscillator operation, reference counter 26 is preset to a predetermined selected count of 20,000, for example. This predetermined count of 20,000 is immediately transferred through the transfer adder 28 into the down-counter 30 to form an existing count therein.

The next millisecond of operation of the sweep oscillator unit comprises a sampling period wherein the number of output signals produced by the voltage controlled oscillator 2 along line 4 is transferred through the transfer gate 40 into the down-counter 30 forming a digital reference signal which causes the down-counter 30 to count down from the existing count therein, that is, from 20,000. Immediately following this sampling period and during the one millisecond interval before the next sampling period, the remaining count in the down-counter 30 is transferred through transfer gate 32 and buffer storage 34 into digital-to-analog converter 36. The output line 38 from digital-to-analog converter 36 then has impressed upon same an analog or direct-current voltage whose sign and magnitude corresponds to the sign and magnitude of the remaining count in the down-counter 30. This output voltage is, as explained above, a control output or an "error" control signal which is impressed upon the input 20 of the voltage controlled oscillator 2 to vary its frequency.

Further, during the one millisecond interval following each sampling period, reference control 24 again presets into the reference counter 26 a digital number of 20,000 which is added to any existing count in the down-counter 30 by transfer adder 28. The sweep oscillator unit is now ready for the next successive sampling period of one millisecond wherein the number of output signals generated causes the down-counter to count down from the new existing count and to produce another "error" control signal if the actual number of output signals does not correspond to the existing count within the down-counter 30. Accordingly, as is evident, the above-described sweep socillator unit periodically samples the output signal frequency and then dynamically corrects same continuously during operation thereof.

If a "start" pulse is received from functional block 14, gate 12 is opened allowing crystal oscillator 10 to drive counter 16 and effect a unidirectional ramp voltage from the digital-to-analog converter 18. This unidirectional ramp voltage is impressed upon input line 20 and causes the voltage controlled oscillator 2 to generate a ramp frequency characteristic train of output signals upon line 4. This ramp frequency characteristic is depicted by reference numeral 54 on the frequency-time curve 50 in FIGURE 2 and commences at the zero millisecond division. The feedback arrangement when sweep frequency output signals are generated operates in a similar manner as that described above with one major exception. Obviously, when the voltage controlled oscillator 2 is generating a ramp frequency characteristic train of output signals, the actual number of output signals produced during each successive one millisecond sampling period does not remain constant but varies in a linear manner. For example, during the time interval between zero and one milliseconds, the actual number of output signals produced by the voltage controlled oscillator 2 would be equal to 19,975 if the unit were operating in a perfectly linear fashion. It is also evident that during each successive one millisecond period during the generation of the ramp frequency, the number of output signals produced by the voltage controlled oscillator 2 will decrease by 25. Referring to the frequency-time curve of FIGURE 2, it is apparent that after one millisecond of sweep operation, the actual frequency generated would be $19.95\times10^6$ c.p.s. The actual frequency generated after 2 milliseconds of an operation in the frequency ramp mode of operation would be $19.90\times10^6$ c.p.s. and, after each successive millisecond, the actual frequency generated would further decrease. In other words, since the sweep period has been assumed to be 200 milliseconds for purposes of illustration and since the actual generated frequency has been assumed to decrease in a linear manner from $20\times10^6$ c.p.s. to $10\times10^6$ c.p.s. during this sweep period, the sweep "rate" accordingly is $50\times10^3$ cycles per millisecond.

In view of the changing number of actual output signals occurring during each millisecond of the ramp frequency sweep, reference counter 26 in the feedback arrangement cannot be preset to the same predetermined selected count prior to each sampling period as was the case when the voltage controlled oscillator generated a constant "rest" frequency. Rather, the count preset into the reference counter 26 must vary such that the count is fifty less than the count inserted prior to a preceding sampling period.

With the above in mind, the system operation and timing will be discussed when the voltage controlled oscillator 2 is generating the ramp frequency characteristic train of output signals. As soon as the "start" pulse is received from functional block 14, the voltage controlled oscillator 2 commences its generation of the frequency ramp and the reference control 24 immediately presets reference counter 26 to a value of 19,975 counts, this count being added through the transfer adder 28 to form an existing count in the down-counter 30 and prepare the unit for the first sampling period. Now, during the first millisecond of operation, sampling of the number of output signals produced by the voltage controlled oscillator 2 takes place and a sampling signal equal to said number of output signals produced during this first millisecond is inserted into the down-counter 30 via transfer gate 40 causing the down-counter 30 to count downwardly from the existing count therein. As described above, if the frequency of the train of output signals generated by the voltage controlled oscillator 2 followed a downward linear ramp, 19,975 output signals would be produced during the first millisecond of operation causing the down-counter 39 to count down from the preset number of 19,975 set therein to thus leave no remaining signal and, therefore, no "error" control signal. If, however, a remaining count did exist in the down-counter 30 after completion of the first sampling interval between zero and one milliseconds, this remaining count would be transferred prior to the next sampling period, that is during the interval between one and two milliseconds, into the digital-to-analog converter 36 via transfer gate 32 and buffer storage 34. The digital-to-analog converter 36 would then produce a unidirectional voltage upon line 38 corresponding to the digital count fed therein, this unidirectional voltage being the "error" control signal and serving to modify the output frequency of the voltage controlled oscillator 2 as described above.

During the interval between sampling periods, that is during the interval between the first and second millisecond of operation, the reference control 24 again presets the reference counter 26 to a predetermined count, in this case to a count of 19,925 this count being added through the transfer adder 28 to any existing count in the down-counter 30 to thus form a new existing count and bring the feedback arrangement into a state of readiness for the next sampling period during the third millisecond of operation. Throughout the entire sweep period of 200 milliseconds of operation and generation of the frequency ramp, the same procedure of alternate sampling and correction of the output frequency takes place and accordingly, the train of output signals truly is dynamically corrected. After completion of the 200 millisecond sweep, a "stop" pulse again would be generated by functional block 14 causing the voltage controlled oscillator 2 to revert back to its "rest" condition and generate a constant nominal frequency of $20\times10^6$ c.p.s., this "rest" frequency again being periodically sampled and controlled by operation of the feedback arrangement.

As is apparent, and as mentioned above, the subject inventive sweep oscillator unit possesses versatility and can be adapted for use with virtually any piece of utilization equipment since the components comprising the sweep oscillator unit can be dimensioned in any suitable fashion to effect a sweep period of any desired duration between any two desired frequencies without departing from the scope of the invention. Additionally, reference counter 26 and down-counter 30 do not necessarily have to contain a capacity of 20,000 or more counts as described in the above exemplary operations since it is entirely possible and, in fact, contemplated to dimension each of these counters to have a capacity much less than 20,000. For example, down-counter 30 could be dimensioned to have a capacity of 5,000 counts and, during each sampling period, could recycle upon itself a number of times. Accessory equipment may also be provided for the sweep oscillator unit such as marker 56 which will give the operator or the utilization equipment a marking signal when the sweep or ramp frequency output passes a specified frequency point.

It should now be apparent that the objects initially set forth at the outset of this specification have been successively achieved. Accordingly, what is claimed is:

1. A sweep oscillator, comprising:

(a) controlled oscillator means for generating a train of output signals in response to a driving control signal at a frequency which changes at a predetermined rate with respect to time;

(b) means for periodically detecting deviations from the predetermined rate-of-change of frequency of signal generation; and (c) means responsive to said last-mentioned means for varying the magnitude of said driving control signal to restore the rate-of-change of signal generation to said predetermined rate-of-change;

(d) said detection means comprising: count storing means; means for transferring to said count storing means a predetermined reference count equal to the number of signals which it is desired that said oscillator generate in a sampling period of specified duration in each of successive specified intervals and means for generating in each sampling period a count equal to the number of signals actually generated in the period and for causing said counter to count down during the period from the existing count therein the count indicative of the number of actually generated signals, whereby the counter contains at the end of the period no count or an error count indicative of the difference between the actual number of signals generated in the sample period and the number which should have been generated; and (e) the detection responsive means for varying the magnitude of the driving control signal comprising digital-to-analog conversion means operable at the end of each sampling period to convert any error count to an error signal and means for combining said error signal with said driving control signal to thereby modify the magnitude of the latter and accordingly vary the rate at which said output signals are generated by said oscillator.

2. The sweep oscillator of claim 1, wherein the means for generating and transferring a reference count to said count storing means comprises means for generating a count of different magnitude in each of the intervals in which deviations from the predetermined rate-of-change of frequency generation are detected and corrected, whereby the rate of signal generation may be made to change linearly.

3. The oscillator of claim 1, wherein:

(a) said count storing means is a down counter; and (b) the means for generating the reference count and transferring it to said down counter comprises a reference counter, a clock controlled reference control for presetting said counter to a specified count in each interval in which the deviation from the predetermined rate-of-change of signal generation is determined, and a transfer adder connected between said reference counter and said down counter.

4. The oscillator of claim 1, wherein:

(a) said count storing means is a down counter; and (b) the means for transferring the count indicative of the number of signals generated in each sampling period to said down counter comprises a clock controlled transfer gate connected between said oscillator and said down counter.

5. A sweep oscillator, comprising:

(a) controlled oscillator means for generating a train of output signals in response to a driving control signal;

(b) means for generating said driving control signal having a first mode of operation in which it generates a signal capable of so driving said oscillator as to cause it to generate said signals at a fixed rest frequency and a second mode of operation in which it generates a signal capable of so driving said oscillator as to cause it to generate signals at a frequency which changes at a specified rate with respect to time;

(c) means for periodically detecting deviations both from the generation of signals at rest frequency and from the predetermined rate-of-change of frequency of signal generation depending upon the mode of operation of the driving control signal generating means; and (d) means responsive to said last-mentioned means for varying the magnitude of said driving control signal to restore the rate of signal generation to the rest frequency and the rate-of-change of signal generation to said predetermined rate-of-change, depending upon the mode of operation of the driving control signal generating means.

6. The sweep oscillator of claim 5, wherein: the means for generating the driving control signal comprises a crystal oscillator, a digital counter driven by said oscillator, a digital-to-analog converter connected to said counter and capable in a first mode of operation of converting the digital input to the signal which will so drive the controlled oscillator as to cause it to generate said signals at a fixed rest frequency and in a second mode of operation of converting said input to the signal which will so drive said controlled oscillator as to cause it to generate said signals at a frequency which changes at the specified rate with respect to time; and externally controllable means for switching said convertor from one to the other of said modes of operation.

7. The sweep oscillator of claim 5, wherein:

(a) said detection means comprises: count storing means; means for transferring to said count storing means a predetermined reference count equal to the number of signals which it is desired that said oscillator generate in a sampling period of specified duration in each of specified intervals and means for generating in each sampling period a count equal to the number of signals actually generated in the period and for causing said counter to count down during the period from the existing count therein the count indicative of the number of actually generated signals, whereby the counter contains at the end of the period no count or an error count indicative of the difference between the actual number of signals generated in the sample period and the number which should have been generated; and (b) the detection responsive means for varying the magnitude of the driving control signal comprising digital-to-analog converson means operable at the end of each sampling period to convert any error count to an error signal and means for combining said error signal with said driving control signal to thereby modify the magnitude of the latter and accordingly vary the rate at which said output signals are generated by said oscillator.

8. The sweep oscillator of claim 5, wherein:

(a) the means for generating the driving control signal comprises a crystal oscillator, a digital counter driven by said oscillator, a digital-to-analog converter connected to said counter and capable in a first mode of operation of converting the digital input to the signal which will so drive the controlled oscillator as to cause it to generate said signals at a fixed rest frequency and in a second mode of operation of converting said input to the signal which will so drive said controlled oscillator as to cause it to generate said signals at a frequency which changes at the specified rate with respect to time; and externally controllable means for switching said converter from one to the other of said modes of operation;

(b) said detection means comprises count storing means comprising a down counter; means for generating and transferring to said down counter a predetermined reference count equal to the number of signals which it is desired that said oscillator generate in a sampling period of specified duration in each of specified intervals and means for generating in each sampling period a count equal to the number of signals actually generated in the period and for causing said counter to count down during the period from the existing count therein the count indicative of the number of actually generated signals, whereby the counter contains at the end of the period no count or an error count indicative of the difference between the actual number of signals generated in the sample period and the number which should have been generated;

(c) the means for generating the reference count and transferring it to said down counter comprises a reference counter, a clock controlled reference control for presetting said counter to a specified count in each interval in which the deviation from the predetermined rate-of-change of signal generation is determined and having one mode of operation in which it presets said reference counter to the same count in each interval and a second mode of operation in which the number of counts is changed in stepwise fashion in succeeding intervals, and a transfer adder connected between said reference counter and said down counter;

(d) said externally controllable means comprising means for switching said reference control to said one mode of operation as it switches said converter to the first mode of operation thereof and for switching said control to said other mode of operation as it switches the converter to the second mode of operation thereof.

9. A sweep oscillator comprising:

(a) controlled oscillator means for generating a train of output signals, said controlled oscillator means being responsive to an input signal for generating a train of output signals having a ramp frequency characteristic;

(b) control means coupled to said controlled oscillator means for selectively producing said input signal; and (c) digital sampling means coupled to said controlled oscillator means for periodically sampling said train of output signals and producing a control output responsive theretof, said control output of said digital sampling means modifying said input signal in response to said periodic sampling to effect linearity of said ramp frequency characteristic, said digital sampling means comprising counter means; means for inserting a selected count into said counter means prior to each periodic sampling; means for inserting a number of counts into said counter means equal to the number of output signals in said train of output signals during each periodic sampling; said counter means subtracting said number of counts from the existing count therein to produce said control output.

10. A sweep oscillator as defined in claim 9, wherein said counter means comprises a down-counter, said number of counts equal to the number of output signals in said train of output signals during each periodic sampling that are inserted into said counter means causing said counter means to count in a downward fashion from said existing count therein; and wherein the count remaining in said counter means subsequent to each periodic sampling produces said control output.

References Cited

UNITED STATES PATENTS

| | | | |
|---|---|---|---|
| 3,144,623 | 8/1964 | Steiner | 331—178 |
| 3,364,437 | 1/1968 | Loposer et al. | 331—4 |
| 3,382,460 | 5/1968 | Blitz et al. | 331—4 |

JOHN KOMINSKI, Primary Examiner

U.S. Cl. X.R.

331—178; 325—335

UNITED STATES PATENT OFFICE
CERTIFICATE OF CORRECTION

Patent No. 3,504,294 March 31, 1970

Francis C. Martin, Jr.

It is certified that error appears in the above identified patent and that said Letters Patent are hereby corrected as shown below:

Column 3, line 61, "monotor" should read -- monitor --. Column 6, line 64, "39" should read -- 30 --. Column 10, line 31, "theretof" should read -- thereto --.

Signed and sealed this 15th day of September 1970.

(SEAL)
Attest:

Edward M. Fletcher, Jr.
Attesting Officer

WILLIAM E. SCHUYLER, JR.
Commissioner of Patents